(12) United States Patent
Gormley et al.

(10) Patent No.: US 7,045,869 B2
(45) Date of Patent: May 16, 2006

(54) SEMICONDUCTOR WAFER COMPRISING MICRO-MACHINED COMPONENTS

(75) Inventors: Colin Stephen Gormley, Belfast (IE); Stephen Alan Brown, Newtownards (IE); Scott Carlton Blackstone, Alton, NH (US)

(73) Assignee: Analog Devices, Inc., Norwood, MA (US)

( * ) Notice: Subject to any disclaimer, the term of this patent is extended or adjusted under 35 U.S.C. 154(b) by 184 days.

(21) Appl. No.: 10/786,426

(22) Filed: Feb. 25, 2004

(65) Prior Publication Data

US 2004/0169284 A1   Sep. 2, 2004

Related U.S. Application Data

(63) Continuation of application No. 10/194,392, filed on Jul. 12, 2002, now Pat. No. 6,723,579.

(51) Int. Cl.
*H01L 27/14* (2006.01)

(52) U.S. Cl. .................................. 257/414; 257/432
(58) Field of Classification Search ............... 257/414, 257/417, 418, 419, 431, 432, 436, 443
See application file for complete search history.

(56) References Cited

U.S. PATENT DOCUMENTS

| | | | |
|---|---|---|---|
| 5,554,304 A | 9/1996 | Suzuki | |
| 5,646,072 A | 7/1997 | Maudie et al. | |
| 5,721,162 A | 2/1998 | Schubert et al. | |
| 5,895,233 A | 4/1999 | Higashi et al. | |
| 6,201,631 B1 | 3/2001 | Greywall | |
| 6,668,109 B1* | 12/2003 | Nahum et al. | 385/18 |
| 2002/0057863 A1* | 5/2002 | Nahum et al. | 385/18 |
| 2003/0203530 A1 | 10/2003 | Lee et al. | |

* cited by examiner

Primary Examiner—Tuan H. Nguyen
(74) Attorney, Agent, or Firm—Gauthier & Connors LLP

(57) ABSTRACT

A semiconductor wafer having a matrix array of micro-mirrors comprises a component substrate carried on a base substrate. The component substrate comprises a membrane layer in which the micro-mirrors are formed and a supporting handle layer. The base substrate comprises a base layer from which a plurality of pedestals extend upwardly therefrom into cavities in the handle layer corresponding to the micro-mirrors. Each pedestal carries electrodes for co-operating with the micro-mirrors for tilting thereof. Conductors through vias in the pedestals connect the electrodes to electrically conductive tracks on a bottom surface, and in turn through conductors through vias to addressing terminals for addressing the electrodes. By forming the pedestals in the base substrate and projecting the pedestals into the cavities in the handle layer the handle layer is recessed into the base substrate thereby facilitating the provision of a handle layer of depth sufficient for adequately supporting the membrane layer during fabrication of the wafer.

24 Claims, 9 Drawing Sheets

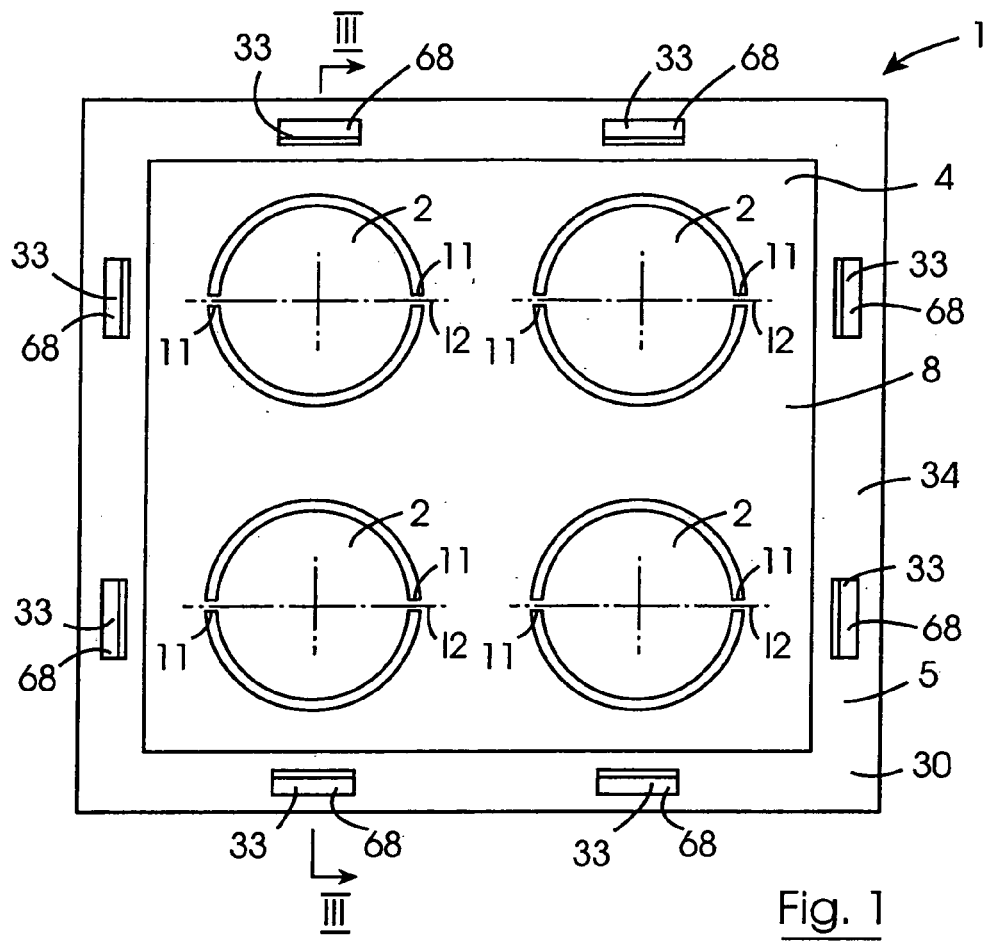
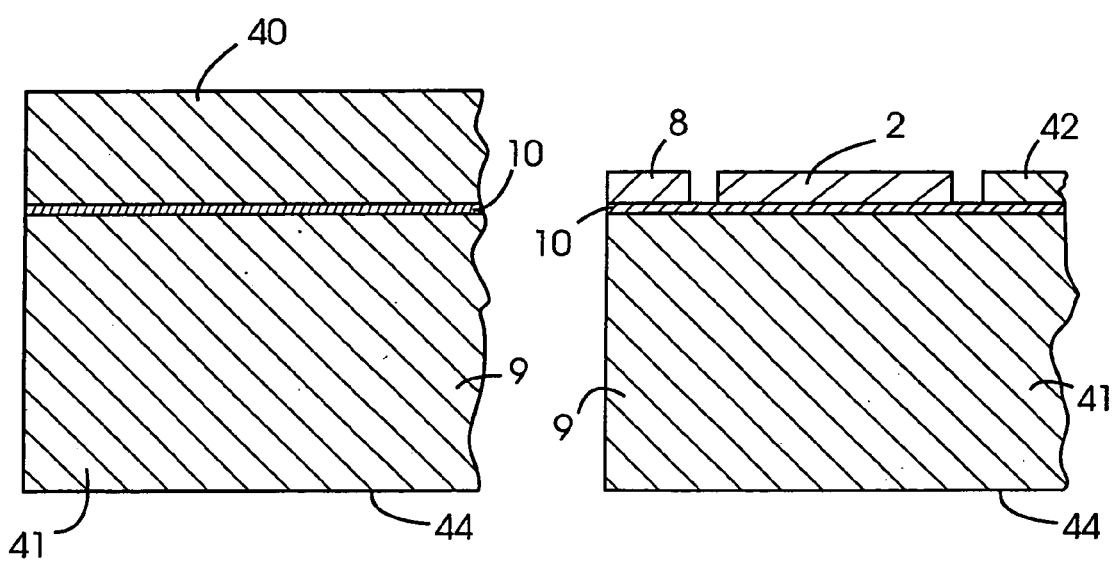
Fig. 1
Fig. 5
Fig. 6

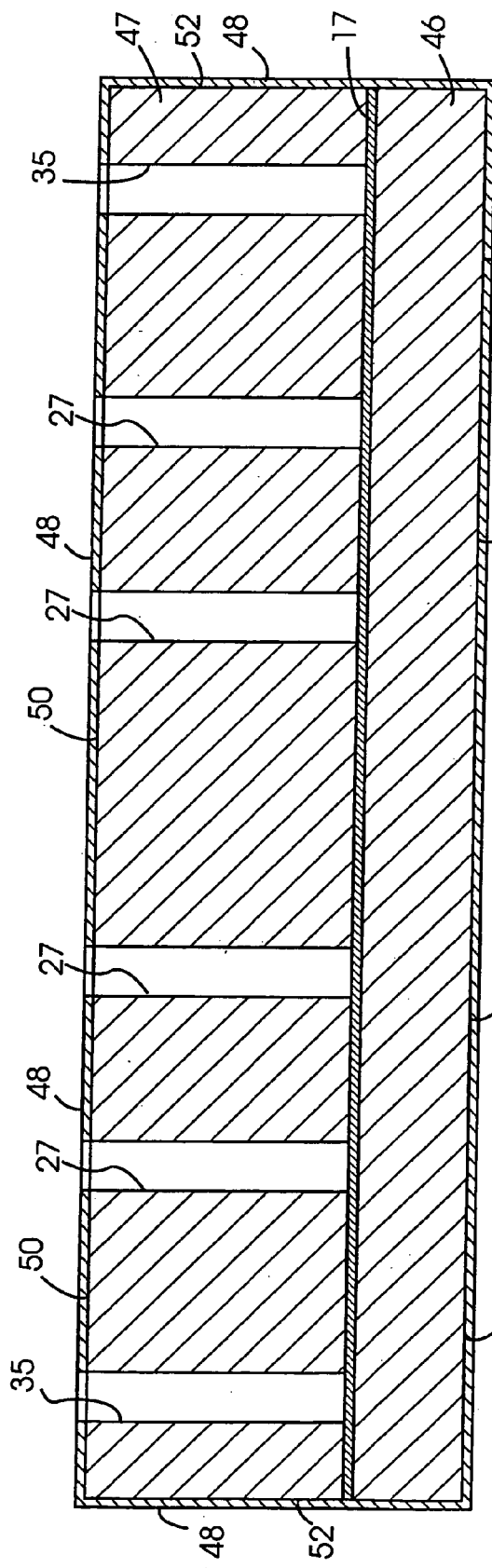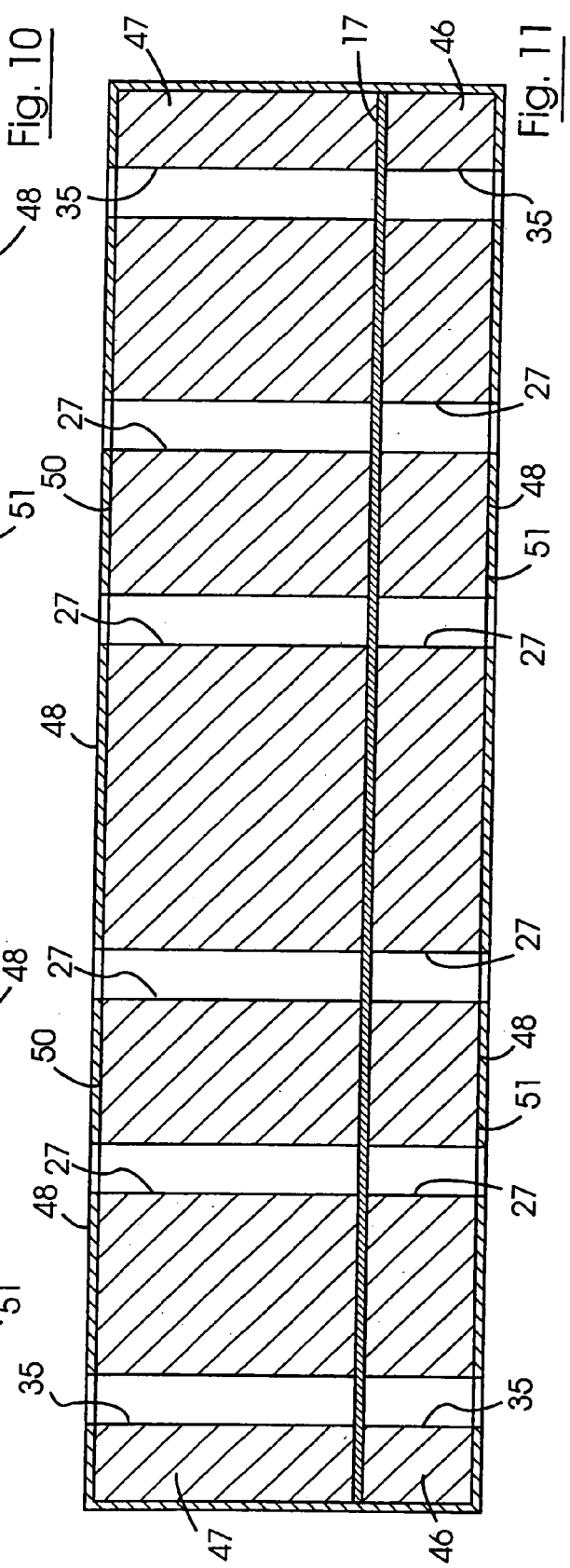

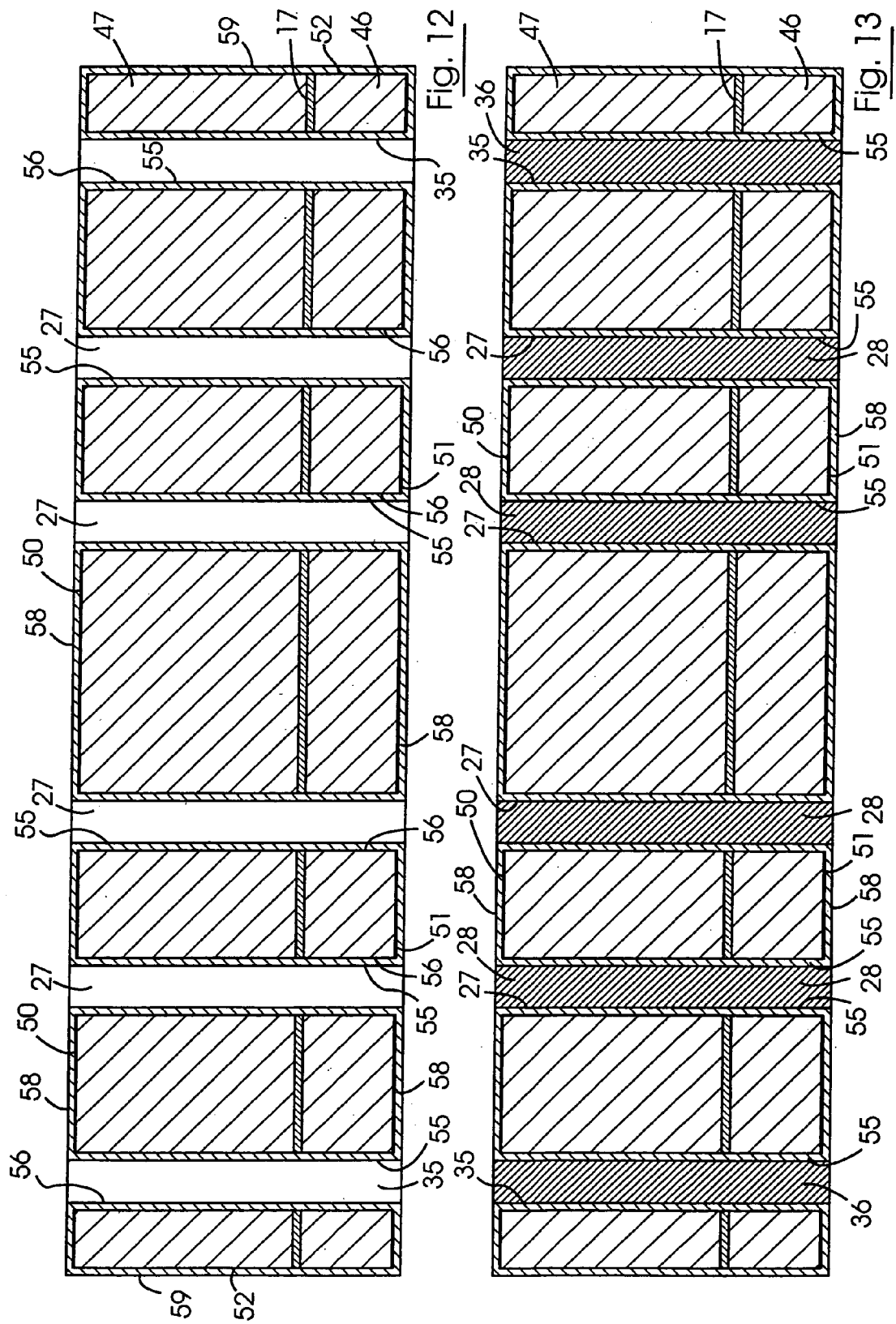

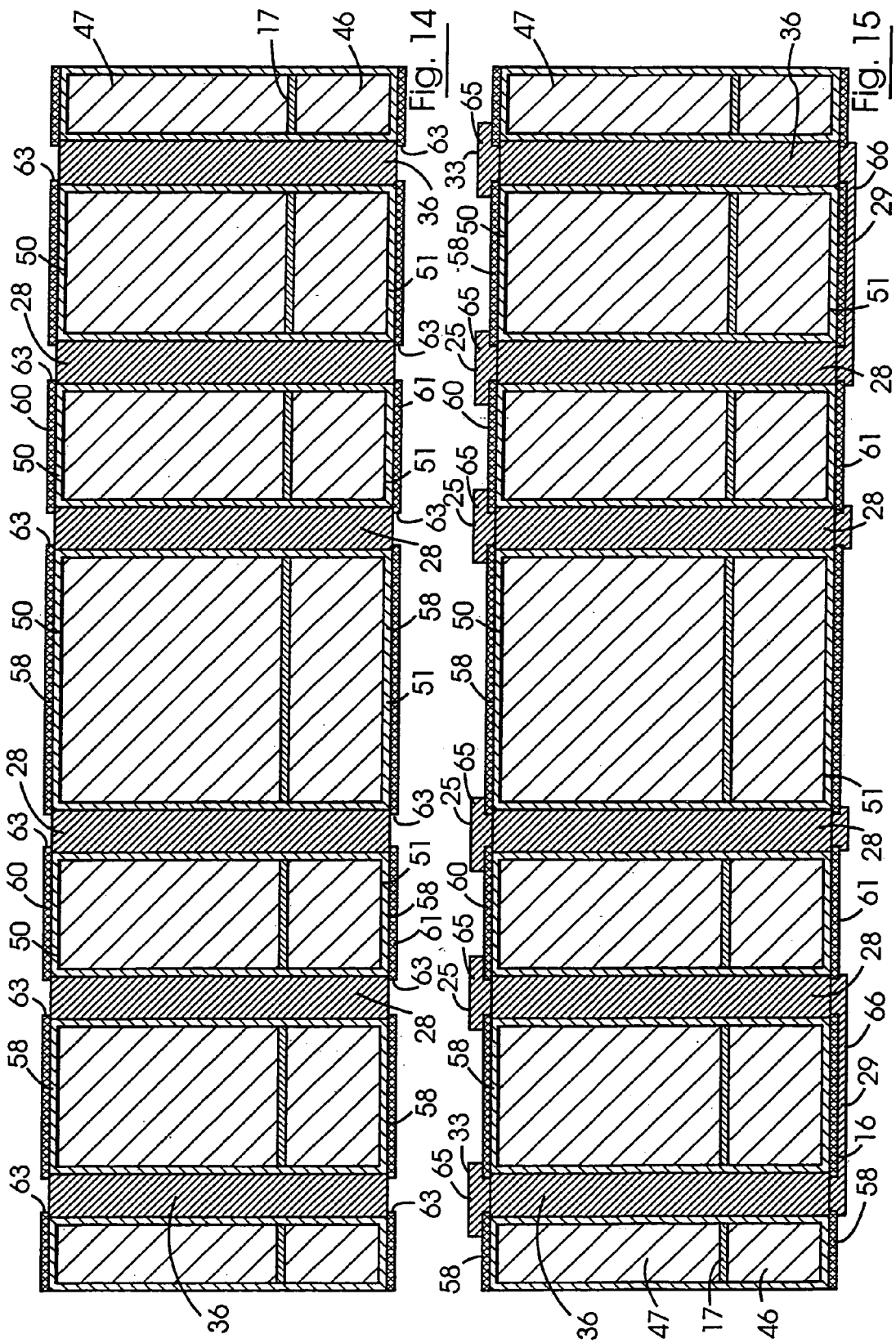

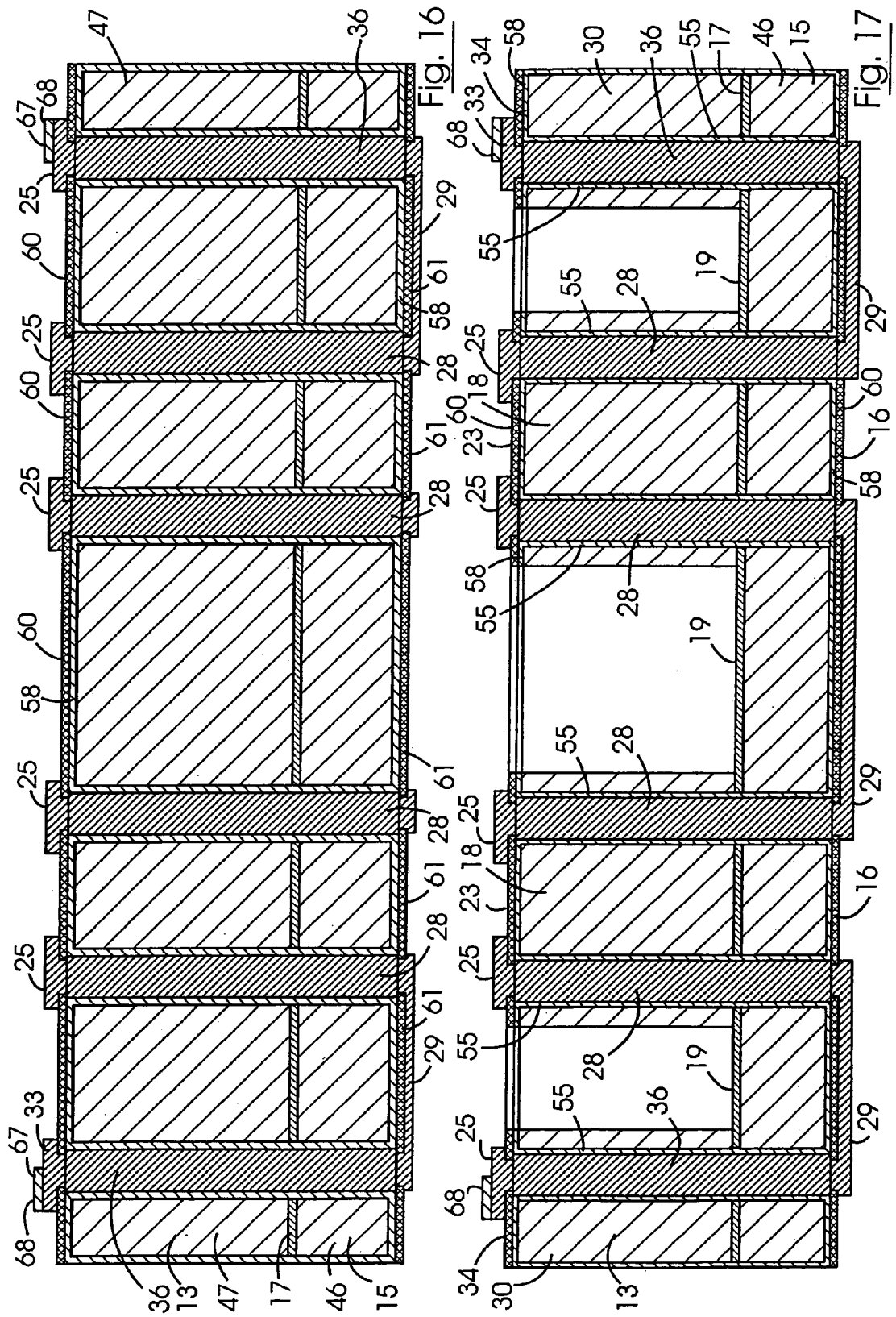

US 7,045,869 B2

SEMICONDUCTOR WAFER COMPRISING MICRO-MACHINED COMPONENTS

PRIORITY INFORMATION

This application is a continuation of U.S. patent application Ser. No. 10/194,392, filed Jul. 12, 2002 now U.S. Pat. No. 6,723,579. The entire contents of U.S. patent application, Ser. No. 10/194,392, are hereby incorporated by reference.

FIELD OF THE INVENTION

The present invention relates to a semiconductor wafer comprising a plurality of micro-machined components, and in particular, though not limited to such a semiconductor wafer comprising micro-mirrors, and the invention also relates to a method for fabricating the semiconductor wafer.

BACKGROUND TO THE INVENTION

Semiconductor wafers comprising a plurality of micro-machined components are well known. Additionally, semiconductor wafers which comprise a plurality of micro-machined micro-mirrors are also well known. For example, U.S. Pat. No. 6,201,631 of Greywall discloses such a semiconductor wafer and also a method for fabricating such a wafer. In general, the micro-mirrors of such semiconductor wafers are arranged in a matrix array formed by a plurality of spaced apart rows and spaced apart columns. Any number of micro-mirrors may be provided, for example, a sixteen by sixteen array of two hundred and fifty-six micro-mirrors is commonly provided. Indeed, it is known to provide micro-mirror arrays of array sizes of two by two arrays up to one thousand by one thousand arrays and even greater.

Typically, such semiconductor wafers comprising an array of micro-mirrors comprise a support substrate, typically a base substrate and a component substrate which are bonded together. The component substrate comprises a handle layer which supports a membrane layer in which the micro-mirrors are formed. Cavities are formed in the handle layer for exposing the micro-mirrors through the handle layer. Typically, a buried oxide layer is located between the membrane layer and the handle layer, and after etching of the cavities in the handle layer the oxide layer adjacent the micro-mirrors is etched for exposing the micro-mirrors through the cavities in the handle layer. Electrodes are formed on the base substrate at appropriate locations, so that when the component substrate is bonded to the base substrate the electrodes are appropriately aligned with the corresponding micro-mirrors through the cavities in the handle layer, for co-operating with the micro-mirrors for tilting thereof.

The handle layer acts as a spacer for spacing the membrane layer with the micro-mirrors formed therein apart from the base substrate, and in turn the electrodes formed thereon for facilitating tilting of the micro-mirrors. The depth by which the handle layer spaces the membrane layer from the base substrate is largely determined by the area of the mirrors, and the maximum angle of tilt required. However, in general, it is desirable that the spacing between the membrane layer and the base substrate should be relatively small so that the electrodes on the base substrate are relatively close to the micro-mirrors, thereby minimising the voltages required on the electrodes for tilting the mirrors. Typically, desired spacings between the base substrate and the membrane layer are in the range of 10 μm to 200 μm. This requires that the handle layer which is supporting the membrane layer must be machined to a depth of between 10 μm and 200 μm, depending on the desired spacing, prior to bonding to the base substrate. This results in a serious problem in that in general, it is desirable that the handle layer should be of a depth of at least 350 μm, and preferably 500 μm for supporting the membrane layer until the membrane layer is otherwise supported, for example, by the base substrate. Thus, by having to reduce the depth of the handle layer to between 10 μm to 200 μm there is a considerable risk of damage to the membrane layer and the micro-mirrors while the membrane layer is supported only by the thin handle layer, until the component layer is bonded to the base substrate. This is undesirable.

There is therefore a need for a semiconductor wafer comprising a plurality of micro-mirrors, or indeed, any other micro-machined components which overcomes this problem. There is also a need for a method for fabricating a semiconductor wafer having a plurality of micro-mirrors or other micro-machined components which similarly overcomes the problem.

The present invention is directed towards providing such a semiconductor wafer and a method.

SUMMARY OF THE INVENTION

According to the invention there is provided a semiconductor wafer comprising a support substrate and a component substrate carried on the support substrate, the component substrate comprising:

a membrane layer having a plurality of spaced apart micro-machined components formed therein, a handle layer supporting the membrane layer and having a plurality of cavities corresponding to the micro-machined components extending through the handle layer to the respective corresponding micro-machined components, the support substrate having a first surface facing in a first direction and defining a second surface facing in a second direction away from and opposite to the first direction, the support substrate defining an intermediate surface at a level intermediate the first and second surfaces and facing in the second direction, the support substrate comprising:

a plurality of spaced apart pedestals extending in the second direction from the intermediate surface into respective corresponding ones of the cavities in the handle layer of the component substrate, each pedestal terminating in the second surface spaced apart from the corresponding micro-machined component for accommodating movement of the micro-machined component, at least one electrode carried on the second surface of each pedestal for co-operating with the corresponding micro-machined component, a plurality of electrically conductive addressing tracks on one of the first and the intermediate surfaces of the support substrate for carrying address signals to be conducted to the respective electrodes, and an electrical conductor corresponding to each electrode extending through a corresponding via through the corresponding pedestal from the electrode to a corresponding one of the addressing tracks on the support substrate for conducting the corresponding address signal to the corresponding electrode.

In one embodiment of the invention a plurality of mutually insulated electrodes are carried on each pedestal, and each electrode is connected to the corresponding one of the addressing tracks on the support substrate by the corresponding one of the electrical conductors extending through the corresponding one of the vias.

Preferably, the addressing tracks on the support substrate communicate the corresponding electrodes on the pedestals with a plurality of corresponding mutually insulated addressing terminals for addressing the electrodes. Advantageously, the support substrate comprises a terminal carrier extending in the second direction from the intermediate surface for carrying the addressing terminals, and an electrical conductor corresponding to each addressing terminal extends from the corresponding addressing terminal through a corresponding via through the terminal carrier to the corresponding one of the addressing tracks on the support substrate for communicating the addressing terminal with the corresponding addressing track. Advantageously, the terminal carrier terminates in the second surface, and the addressing terminals are located on the second surface.

In one embodiment of the invention the addressing tracks are located on the first surface of the support substrate, and preferably, the vias through the respective pedestals extend to the first surface for accommodating the corresponding electrical conductors therethrough to the addressing tracks. Alternatively or additionally, the addressing tracks are located on the intermediate surface of the support substrate, and the vias through the respective pedestals extend to the intermediate surface for accommodating the corresponding electrical conductors to the addressing tracks.

In one embodiment of the invention the handle layer defines a first surface of the component substrate, the first surface of the component substrate facing in the first direction, and the component substrate being carried on the support substrate with the first surface of the component substrate abutting the intermediate surface of the support substrate.

In another embodiment of the invention the support substrate comprises a base layer defining the first and the intermediate surfaces, the pedestals extending in the second direction from the base layer. Advantageously, an insulating layer is located between the base layer and the respective pedestals of the support substrate. Preferably, the insulating layer extends over the surface of the base layer of the support substrate and defines the intermediate surface.

In one embodiment of the invention the transverse cross-sectional area of each pedestal is substantially similar to the area of the corresponding micro-machined component in plan view. Preferably, the transverse cross-sectional area of each cavity in the handle layer of the component substrate substantially defines the transverse cross-sectional area of the corresponding pedestal.

In another embodiment of the invention the respective pedestals are identical to each other, and preferably, the second surfaces of the respective pedestals define a common plane, and advantageously, the second surface defined by the terminal carrier defines a common plane with the second surfaces of the respective pedestals. Preferably, an insulating layer is located between the handle layer and the membrane layer of the component substrate. Advantageously, each cavity through the handle layer of the component substrate extends through the insulating layer between the handle layer and the membrane layer to the corresponding micro-machined component.

In one embodiment of the invention the membrane layer and the handle layer of the component substrate are of semiconductor material, and preferably, the membrane layer and the handle layer of the component substrate are of single crystal silicon material.

In one embodiment of the invention the support substrate is of semiconductor material, and preferably, the support substrate is of single crystal silicon material.

In another embodiment of the invention the micro-machined components are micro-mirrors. Preferably, the respective micro-machined components are identical to each other. Advantageously, the micro-machined components are arranged in a matrix array defining a plurality of spaced apart columns and spaced apart rows of the micro-machined components.

Additionally the invention provides a method for fabricating a semiconductor wafer comprising a plurality of micro-machined components formed therein, the method comprising the steps of:

fabricating a component substrate having a membrane layer supported on a handle layer, forming the micro-machined components spaced apart from each other in the membrane layer, forming a plurality of cavities in the handle layer corresponding to the micro-machined components, each cavity extending through the handle layer to the corresponding micro-machined component, forming a support substrate having a first surface facing in a first direction and defining a second surface facing in a second direction away from and opposite to the first direction and defining an intermediate surface at a level intermediate the first and second surfaces facing in the second direction, forming a plurality of spaced apart pedestals in the support substrate corresponding to the cavities, the pedestals extending from the intermediate surface in the second direction and terminating in the second surface, forming at least one electrode on the second surface of each pedestal, forming a plurality of electrically conductive addressing tracks on one of the first and the intermediate surfaces of the support substrate for carrying signals to be conducted to the respective electrodes, forming a via through each pedestal corresponding to each electrode, each via extending from the second surface of the corresponding pedestal for accommodating a corresponding electrical conductor from the electrode to the corresponding one of the addressing tracks, forming the electrical conductors in the respective vias for connecting the corresponding electrodes to the corresponding addressing tracks, and joining the component substrate to the support substrate so that the pedestals extend into respective corresponding ones of the cavities in the handle layer of the support substrate with the second surfaces defined by the pedestals spaced apart from the corresponding micro-machined components for accommodating movement of the micro-machined components, and the electrodes on the pedestals co-operating with the corresponding micro-machined components.

In one embodiment of the invention a plurality of mutually insulated electrodes are formed on each pedestal, and a corresponding number of vias and electrical conductors are formed through each pedestal for connecting the respective electrodes to corresponding ones of the respective addressing tracks.

Preferably, the vias through the pedestals are formed prior to forming the electrodes thereon.

In one embodiment of the invention a plurality of mutually insulated addressing terminals are formed on the support substrate and are electrically connected to respective corresponding ones of the addressing tracks for addressing corresponding ones of the electrodes.

In another embodiment of the invention a terminal carrier is formed on the support substrate extending from the intermediate surface in the second direction, the addressing terminals being formed on the terminal carrier, a plurality of vias corresponding to the respective addressing terminals are formed extending from the corresponding ones of the addressing terminals through the terminal carrier for accommodating corresponding electrical conductors from the addressing terminals to the corresponding addressing tracks, and the electrical conductors are formed in the respective vias through the terminal carrier for communicating the addressing terminals with the corresponding ones of the addressing tracks for facilitating addressing of the respective electrodes through the corresponding addressing tracks from the corresponding addressing terminals. Preferably, the terminal carrier terminates in the second surface of the support substrate, and the addressing terminals are formed on the second surface of the terminal carrier.

In one embodiment of the invention the addressing tracks are formed on the first surface of the support substrate, and preferably, each via in each pedestal extends through the support substrate to the corresponding addressing track. Alternatively or additionally, the addressing tracks are formed on the intermediate surface of the support substrate, and each via in each pedestal extends to the corresponding addressing track.

In one embodiment of the invention the handle layer defines a first surface of the component substrate, the first surface facing in the first direction, and the component substrate and the support substrate are joined with the first surface of the component substrate abutting the intermediate surface of the support substrate.

In another embodiment of the invention the support substrate is formed by joining a pedestal layer to a base layer, the base layer defining the first surface of the support substrate, and forming the pedestals in the pedestal layer.

In another embodiment of the invention the pedestal layer is patterned by a photo-lithographic process and is then etched for forming the pedestals. Preferably, the terminal carrier is formed in the pedestal layer during etching of the pedestal layer for forming the pedestals.

In one embodiment of the invention an insulating layer is formed between the pedestal layer and the base layer. Preferably, the pedestal layer is etched down to the insulating layer, which acts as an etch stop layer during forming the pedestals.

In one embodiment of the invention an insulating layer is formed between the handle layer and the membrane layer of the component substrate.

In another embodiment of the invention the insulating layer formed between the handle layer and the membrane layer in the component substrate is etched through the corresponding cavities in the handle layer for exposing the micro-machined components in the corresponding cavities. Preferably, the first surface of the handle layer of the component substrate is patterned by a photo-lithographic process for defining the cavities, and the cavities are then etched through the handle layer. Advantageously, the insulating layer between the handle layer and the membrane layer of the component substrate acts as an etch stop layer during etching of the cavities in the handle layer.

ADVANTAGES OF THE INVENTION

The advantages of the invention are many. A particularly important advantage of the invention is that the component substrate is provided with a handle layer of adequate depth for supporting the membrane layer, thereby minimising risk of damage to the membrane layer during fabrication of the semiconductor wafer. This is achieved by virtue of the fact that the support substrate is fabricated with pedestals for carrying the electrodes which extend into the cavities formed in the handle layer of the component substrate. This, thus, permits the handle layer of the component substrate to be recessed into the support substrate, thus permitting a relatively deep handle layer to be provided for supporting the component layer.

A further advantage of the invention is that by virtue of the fact that the electrodes on the pedestals are connected to electrically conductive addressing tracks on the first and/or intermediate surfaces of the support substrate, electronic components such as CMOS devices and other devices may be formed on the first and/or intermediate surfaces of the support substrate of the semiconductor wafer.

These and other advantages and objects of the invention will be readily apparent from the following description of some preferred embodiments thereof, which are given by way of example only, with reference to the accompanying drawings.

BRIEF DESCRIPTION OF THE DRAWINGS

FIG. 1 is a top plan view of a semiconductor wafer according to the invention,

FIG. 5 is a view similar to FIG. 3 of a portion of a part of the semiconductor wafer of FIG. 1 during fabrication, FIG. 6 is a view similar to FIG. 5 of the portion of the part of the semiconductor wafer of FIG. 5 also during fabrication, FIGS. 10 to 17 are transverse cross-sectional end elevational views similar to FIG. 9 illustrating the part of the wafer of FIG. 9 at different stages of fabrication.

DESCRIPTION OF A PREFERRED EMBODIMENT OF THE INVENTION

Figure 9:
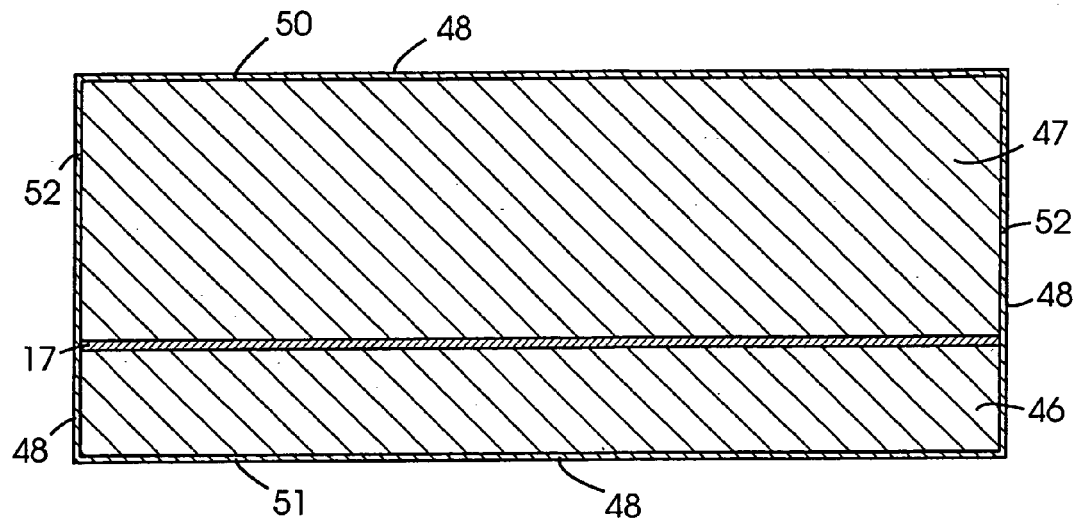
FIG. 9 is a transverse cross-sectional end elevational view similar to FIG. 3 of another part of the wafer of FIG. 1 during fabrication.
Figure 2:
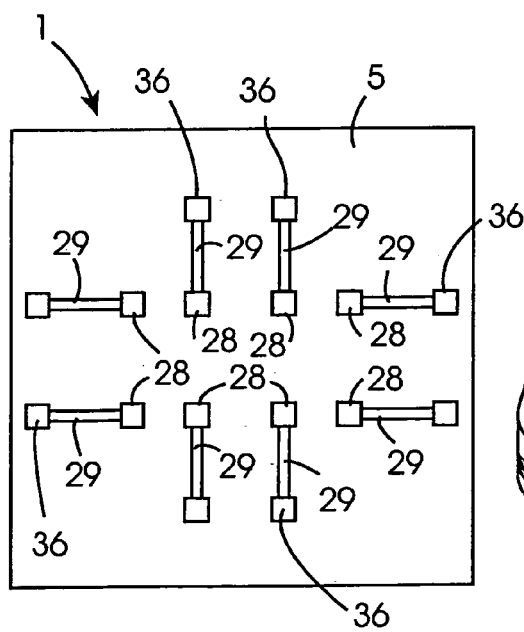
FIG. 2 is an underneath plan view of the semiconductor wafer of FIG. 1.
Figure 8:
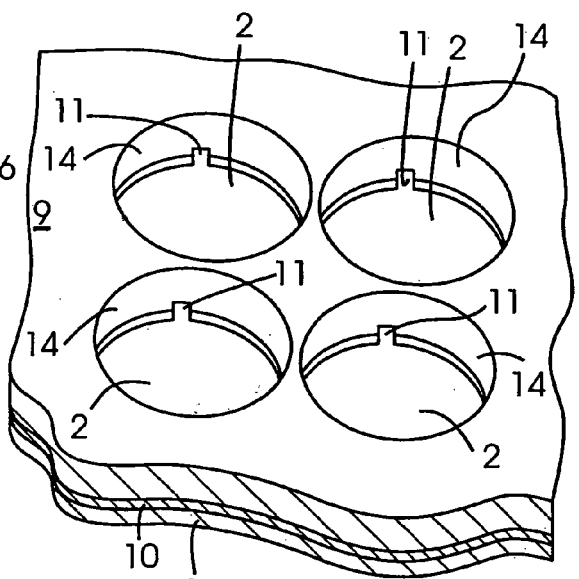
FIG. 8 is an underneath perspective view of the part of the wafer of FIG. 5.
Figure 3:
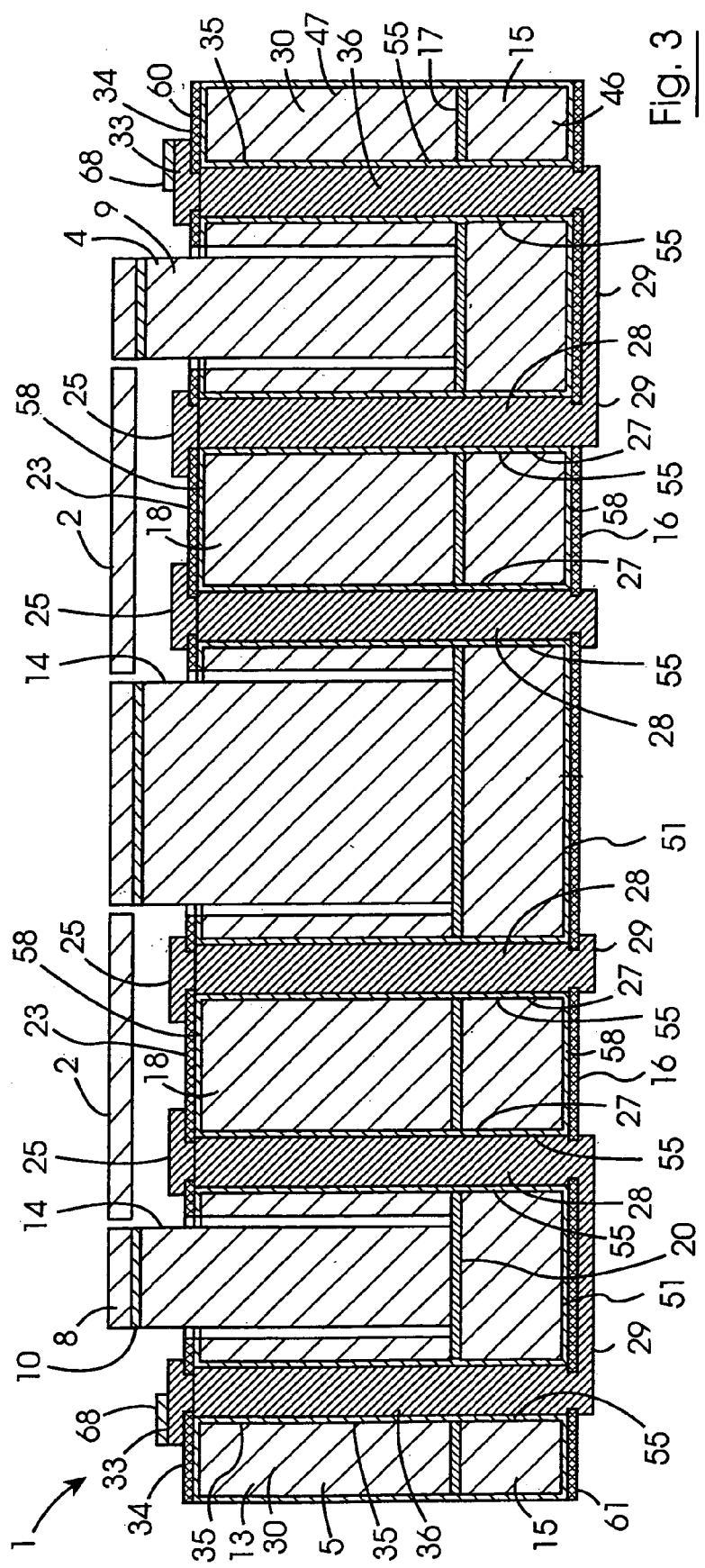
FIG. 3 is a transverse cross-sectional end elevational view of the semiconductor wafer of FIG. 1 on the line III-III of FIG. 1.
Figure 7:
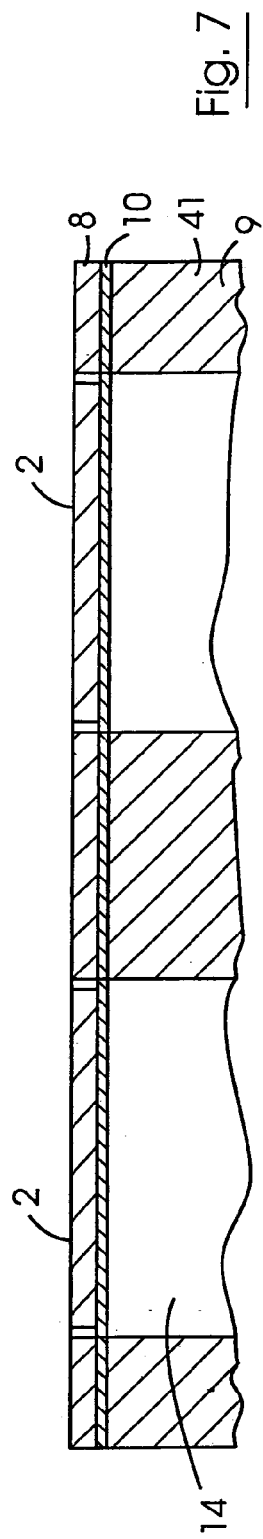
FIG. 7 is a view similar to FIG. 3 of the part of the wafer of FIG. 5 also during fabrication.
Figure 4:
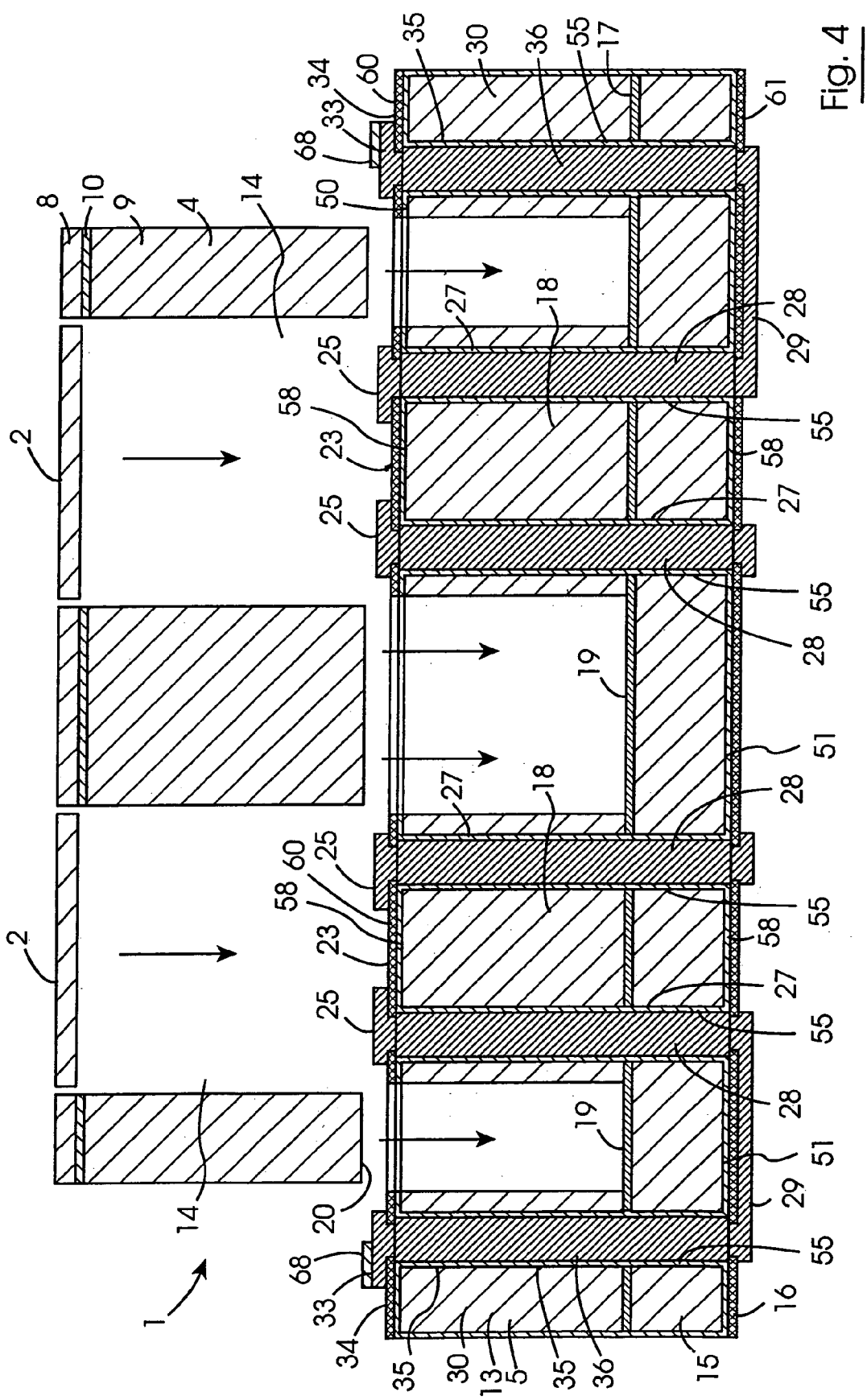
FIG. 4 is a transverse cross-sectional end elevational view similar to FIG. 3 illustrating assembly of the semiconductor wafer of FIG. 1 during fabrication.
Figure 18:
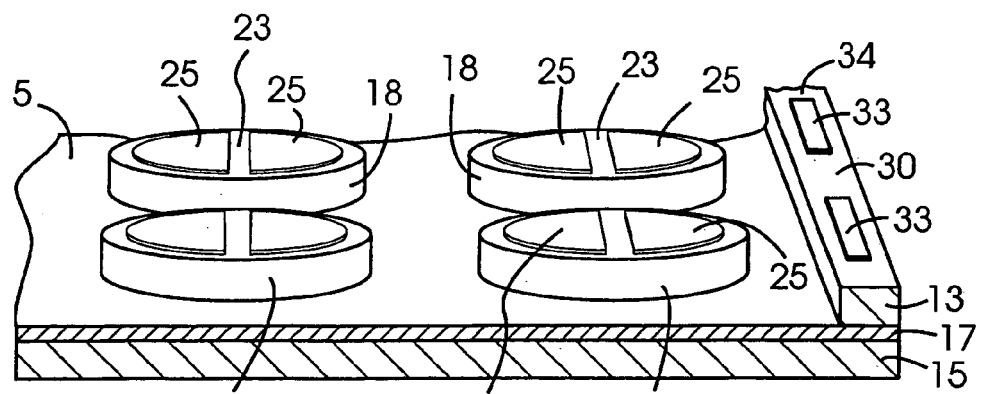
FIG. 18 is a top perspective view of the part of the wafer of FIG. 9.

Referring to the drawings and initially to FIGS. 1 to 4, there is illustrated a semiconductor wafer according to the invention indicated generally by the reference numeral 1 which comprises a two by two matrix array of micro-machined components, namely, micro-mirrors 2. For ease of explanation the wafer 1 is described and illustrated as having only four micro-mirrors 2 arranged in the two by two matrix array, however, in practice, it will be appreciated that the micro-mirror array may comprise any number of micro-mirrors, for example, the micro-mirror array may be a sixteen by sixteen array of two hundred and fifty-six micro-mirrors, and indeed, in many cases the array may be a significantly larger array, for example, an array having up to one thousand six hundred micro-mirrors is feasible. The wafer 1 is formed from two substrates, namely, a component substrate 4 and a support substrate, which in this embodiment of the invention is a base substrate 5. The component substrate 4 is carried on the base substrate 5. Both the component substrate 4 and the base substrate 5 are separately fabricated and subsequently bonded together to form the wafer 1.

The component substrate 4 comprises a membrane layer 8 of single crystal silicon and a handle layer 9 also of single crystal silicon. An insulating layer formed by a buried oxide layer 10 is located between the membrane layer 8 and the handle layer 9. The micro-mirrors 2 are formed in the membrane layer 8, and are connected to the membrane layer 8 by torsion members 11, commonly referred to as ties, extending on respective opposite sides of the micro-mirrors 2 at 180° intervals around the micro-mirrors 2. The torsion members 11 define respective pivot axes 12 about which the micro-mirrors 2 are tiltable. It will, however, be appreciated that any suitable tiltable mounting of the micro-mirrors 2 could be provided, for example, the micro-mirrors 2 may be gimbal mounted to be universally tiltable, as, for example, is described in U.S. Pat. No. 6,201,631. Cavities 14 extending through the handle layer 9 and the oxide layer 10 to the respective micro-mirrors 2 expose the micro-mirrors 2 through the handle layer 9.

The base substrate 5 comprises a base layer 15, a pedestal layer 13 and an insulating layer provided by a buried oxide layer 17 located between the base layer 15 and the pedestal layer 13. The base layer 15 as will be described below defines a first surface, namely, a bottom surface 16 facing in a first direction, namely, downwardly. The pedestal layer 13 as will be described below defines a second surface, namely, a top surface 23 facing in a second direction, namely, upwardly. The oxide layer 17 defines an upwardly facing intermediate surface 19. A plurality of pedestals 18 formed in the pedestal layer 13 extend upwardly from the intermediate surface 19 and into the cavities 14 formed in the handle layer 9. The component substrate 4 and the base substrate 5 are joined together with the pedestals 18 of the base substrate 5 extending into the cavities 14 of the component substrate 4 and with a first surface, namely, a downwardly facing bottom surface 20 defined by the handle layer 9 of the component substrate 4 abutting the intermediate surface 19 of the base substrate 5. The height of the pedestals 18 is such that when the bottom surface 20 of the handle layer 9 is abutting the intermediate surface 19 of the base substrate 5, the respective top surfaces 23 of the corresponding pedestals 18 are spaced apart from the corresponding micro-mirrors 2 for facilitating tilting of the micro-mirrors 2 about their respective pivot axes 12.

Electrodes 25, in this embodiment of the invention two mutually electrically insulated electrodes 25, are provided on the top surface 23 of each pedestal 18 for co-operating with the corresponding micro-mirror 2 for tilting the micro-mirror 2 about the pivot axis 12, when a voltage is applied to the electrodes 25. In the event that the micro-mirrors 2 were gimbal mounted, four electrodes 25 would be provided on the top of each pedestal 18 for providing universal tilting of the micro-mirrors 2. Vias 27 extending through the pedestals 18 and the base layer 15 from the top surfaces 23 of the corresponding pedestals 18 to the bottom surface 16 of the base layer 15 accommodate electrical conductors 28 from the electrodes 25 to corresponding electrically conductive addressing tracks 29 on the bottom surface 16 of the bottom layer 15.

A terminal carrier 30 formed in the pedestal layer 13 extends upwardly from the intermediate surface 19 around the array of micro-mirrors 2 for carrying a plurality of addressing terminals 33 for facilitating addressing of the respective electrodes 25 for selectively tilting the micro-mirrors 2. The addressing terminals 33 are provided on a top surface 34 of the terminal carrier 30, which is formed by the top surface 23 defined by the pedestal layer 13 as will be described below. Vias 35 through the terminal carrier 30 and the base layer 15 accommodate corresponding electrical conductors 36 from the addressing terminals 33 to respective corresponding ones of the addressing tracks 29 for in turn connecting the addressing terminals 33 to the respective corresponding ones of the electrodes 25 for addressing thereof.

Turning now to the fabrication of the semiconductor wafer 1, as mentioned above, the component substrate 4 and the base substrate 5 are separately fabricated. For convenience the fabrication of the component substrate 4 will first be described.

Referring to FIGS. 5 to 8, a wafer 40 of single crystal silicon of approximately 500 μm depth is selected for forming the membrane layer 8. A wafer 41 of single crystal silicon of approximately 500 μm is selected for forming the handle layer 9. The buried oxide layer 10 may be grown on either of the wafers 40 or 41, however, in this embodiment of the invention the buried oxide layer 10 is grown on the wafer 41 to a depth of approximately 500 nm. The wafer 40 is then fusion bonded to the buried oxide layer 10. The wafer 40 is machined to a desired depth, typically, between 2 μm and 30 μm, depending on the desired thickness of the micro-mirrors 2, to form the membrane layer 8. After machining of the wafer 40, a photo-resist layer (not shown) is deposited on a top surface 42 of the membrane layer 8 and is patterned by a suitable photo-lithographic process for defining the micro-mirrors 2 and the torsion members 11. The membrane layer 8 is then etched through the patterned photo-resist layer (not shown) to form the micro-mirrors 2 and the corresponding torsion members 11, see FIG. 6.

A photo-resist layer (not shown) is deposited on a bottom surface 44 of the wafer 41 which is patterned by a photo-lithographic process for defining the respective cavities 14. The wafer 41 is then etched through, using the photo-resist layer (not shown) as a mask, for forming the cavities 14, see FIG. 7. On the formation of the cavities 14 in the wafer 41 the exposed buried oxide layer 10 adjacent the micro-mirrors 2 and the torsion members 11, and exposed by the cavities 14 is removed for exposing the micro-mirrors 2 through the cavities 14. The photo-resist layers (not shown) are then removed from the top and bottom surfaces 42 and 44 of the membrane layer 8 and the wafer 41, respectively. If the depth of the wafer 41 is greater than required, at this stage the wafer 41 is machined to the appropriate depth, and thereby the handle layer 9 is formed. In general the wafer layer 41 is not machined to a depth less than 300 μm for providing adequate support of the membrane layer 8 with the micro-mirrors 2 formed therein, during handling of the component substrate 4. In this embodiment of the invention the handle layer is machined to a depth of approximately 350 μm. At this stage, fabrication of the component substrate 4 is completed.

Referring to FIGS. 9 to 18, fabrication of the base substrate 5 will now be described. A wafer 46 of single crystal silicon of approximately 500 μm depth is selected for forming the base layer 15. A wafer 47 of single crystal silicon also of approximately 500 μm depth is selected for forming the pedestal layer 13 in which the pedestals 18 and the terminal carrier 30 are formed. The buried oxide layer 17 may be grown on either of the wafers 46 or 47, however, in this embodiment of the invention the buried oxide layer 17 is grown on the wafer 46 to a depth of approximately 1 μm, and the wafer 47 is fusion bonded to the buried oxide layer 17. The wafers 46 and 47 are then machined to the desired depths. In this embodiment of the invention the wafer 46 is machined to a depth of approximately 130 μm, while the wafer 47 is machined to a depth of approximately 270 μm. A tetraethyloxysilane (TEOS) oxide layer 48 is deposited over top and bottom surfaces 50 and 51 of the wafers 47 and 46, respectively, and side and end walls, only the side walls 52 being illustrated in FIGS. 9 to 17, see FIG. 9. The TEOS oxide layer 48 is deposited to a depth of approximately 2 μm.

Photo-resist layers (not shown) are deposited on the oxide layers 48 over the top and bottom surfaces 50 and 51, and are patterned by a suitable photo-lithographic process for defining the vias 27 through the pedestals 18 and the base layer 15, which are subsequently formed in the wafers 46 and 47, and also for defining the vias 35 through the terminal carrier 30 and the base layer 15, which are likewise subsequently formed in the wafers 46 and 47. Alignment marks (not shown) are patterned on the photo-resist layers on the oxide layers 48 on the respective top and bottom surfaces 50 and 51 for facilitating alignment during etching of the vias 27 and 35 into the respective wafers 46 and 47. The vias 27 and 35 are etched through the wafers 46 and 47 to the buried oxide layer 17 which acts as an etch stop for both wafers 46 and 47, see FIGS. 10 to 12. During the etching of the vias 27 and 35 through the wafers 46 and 47, the alignment marks (not shown) patterned in the photo-resist layers are etched into the wafers 46 and 47 for facilitating alignment during subsequent fabrication of the base substrate 5. When the vias 27 and 35 have been etched through the wafers 46 and 47, the exposed portions of the oxide layer 17 in the vias 27 and 35 are removed by an RIE etch. The photo-resist layers (not shown) are removed by a suitable process, and the TEOS oxide layer 48 is also removed by a suitable process, typically, with a dilute hydrofluoric acid etch.

An oxide layer 55 is grown to a depth of approximately 1 μm on side walls 56 of the respective vias 27 and 35 for forming an insulating layer thereon. Simultaneously an oxide layer 58 is grown over the top and bottom surfaces 50 and 51, respectively, of the wafers 47 and 46, respectively, see FIG. 12. Also an oxide layer 59 is grown on the side and end walls, although only the oxide layers 59 on the side walls 52 are illustrated.

The electrical conductors 28 and 36 are next formed through the vias 27 and 35, respectively. The conductors 28 and 36 are formed by filling the vias 27 and 35 with an electrically conductive material, which may be metallic, for example, aluminium, or a highly doped semiconductor material. In this embodiment of the invention, the conductors 28 and 36 are of doped polysilicon, which is deposited in the vias 27 and 35, see FIG. 13.

Oxide layers 60 and 61 are next deposited over the oxide layers 58 on the respective top and bottom surfaces 50 and 51 for forming electrical insulation layers with the oxide layers 58 on the top and bottom surfaces 50 and 51 of the wafers 47 and 46, respectively. Photo-resist layers (not shown) are deposited on the oxide layers 60 and 61 and are patterned by a suitable photo-lithography process to define vias 63 through the oxide layers 60 and 61 to the conductors 28 and 36, respectively. The oxide layers 60 and 61 are then etched for forming the vias 63, see FIG. 14, and the photo-resist layer (not shown) is removed.

Respective layers 65 and 66 of polysilicon are deposited to a depth of approximately 2 μm over the respective oxide layers 60 and 61, and through the vias 63 in the oxide layers 60 and 61 to make electrical contact with the conductors 28 and 36. The respective polysilicon layers 65 and 66 may be formed by depositing polysilicon and then doping the deposited polysilicon by solid source doping, or alternatively, doped polysilicon may be directly deposited on the respective oxide layers 60 and 61. A photo-resist layer (not shown) is deposited on the layer 65 of polysilicon, and is patterned by a suitable photo-lithography process for defining the electrodes 25 and the addressing terminals 33, and the layer 65 is then etched for forming the respective electrodes 25 and the addressing terminals 33, see FIG. 15. A photo-resist layer (not shown) is deposited on the layer 66 of polysilicon and is patterned by a suitable photo-lithographic process for defining the electrically conductive addressing tracks 29 formed on the base substrate 5, and the electrically conductive tracks are thus formed by etching, see FIG. 15. The photo-resist layers (not shown) are then removed.

A layer 67 of aluminium is deposited over the oxide layer 60 and the electrodes 25 and the addressing terminals 33 to a depth of approximately 1 μm for forming terminal pads 68 on the addressing terminals 33, only, for facilitating external connections to the addressing terminals 33. A photo-resist layer (not shown) is deposited over the aluminium layer 67 which is patterned by a suitable photo-lithographic process for defining the terminal pads 68 on the addressing terminals 33, and the aluminium layer 67 is etched for leaving only the terminal pads 68 on the addressing terminals 33, see FIG. 16.

A photo-resist layer (not shown) is again deposited over the oxide layer 60, the electrodes 25, the addressing terminals 33 and the terminal pads 68, and is patterned by a suitable lithography process to define the pedestals 18 and the terminal carrier 30. The assembly is then subjected firstly to an RIE etch for etching through the oxide layer 60, and then to a DRIE Bosch process etch for etching through the pedestal layer 13 to the intermediate surface 19 of the buried oxide layer 17 for forming the pedestals 18 and the terminal carrier 30. The buried oxide layer 17 acts as an etch stop layer for preventing etching beyond the buried oxide layer 17 into the base layer 15. The photo-resist layer is then removed, and at this stage, the fabrication of the base substrate 5 has been completed. The base substrate 5 has been formed with the pedestals 18 and the terminal carrier 30, and the electrodes 25 are formed on the corresponding pedestals 18, as are the addressing terminals 33 and the terminal pads 68 formed on the terminal carrier 30. The electrically conductive addressing tracks 29 are formed on the bottom surface 16 of the base substrate 5, and the electrodes 25 are electrically connected to their corresponding addressing terminals 33 through corresponding conductors 28 and 36 and the corresponding addressing tracks 29.

The component substrate 4 and the base substrate 5 are assembled together by urging the respective substrates 4 and 5 towards each other with the bottom surface 20 defined by the handle layer 9 facing the intermediate surface 19 of the base substrate 5. The pedestals 18 are urged into the cavities 14 until the bottom surface 20 defined by the handle layer 9 abuts the intermediate surface 19 defined by the buried oxide layer 17 of the base substrate 5. When the bottom surface 20 of the handle layer 9 is tightly abutting the intermediate surface 19 of the base substrate 5, the top surfaces 23 of the pedestals 18 and the electrodes 25 are spaced apart approximately 100 µm from the corresponding micro-mirrors 2. Thus, sufficient spacing is provided between the micro-mirrors 2 and the electrodes 25 of the pedestals 18 for facilitating adequate tilting of the micro-mirrors 2, while at the same time maintaining the spacing between the electrodes 25 and the micro-mirrors 2 such that the voltage required on the electrodes 25 for tilting the micro-mirrors 2 is not excessive.

However, most importantly, the desired spacing between the electrodes 25 and the micro-mirrors 2 has been achieved, while still maintaining the handle layer of a depth, in this embodiment of the invention 350 µm for adequately supporting the membrane layer 8 during assembly of the respective component and base substrates 4 and 5. This has been achieved by virtue of the fact that the base substrate 5 has been formed with the pedestals 18 extending upwardly into the cavities, and thereby permitting the handle layer 9 to be recessed into the base substrate 5.

In this embodiment of the invention the micro-mirrors 2 are identical to each other, are circular of diameter approximately 1,000 µm, and are planar defining a common plane. The micro-mirrors 2 are tiltable through an angle of approximately ±11° about the torsion members 11 from the common plane. Additionally, the cavities 14 formed in the handle layer 9 are identical to each other, and are also of circular transverse cross-section, and are of transverse cross-sectional area slightly greater than the area of the micro-mirrors for accommodating the torsion members 11, see FIG. 8. The pedestals 18 are identical to each other, and are also of circular transverse cross-section, see FIG. 18, and are of transverse cross-sectional area substantially similar to the transverse cross-sectional area of the cavities 14 in the handle layer 9 for facilitating a relatively tight, but nonetheless sliding fit of the pedestals 18 into the cavities 14. Although in FIG. 3 the pedestals 18 are illustrated as being a particularly loose fit in the cavity 14, this is solely for the purpose of ease of illustration. Additionally, the top surfaces 23 of the pedestals 18 and the top surface 34 of the terminal carrier 13 define a common plane.

Figure 20:
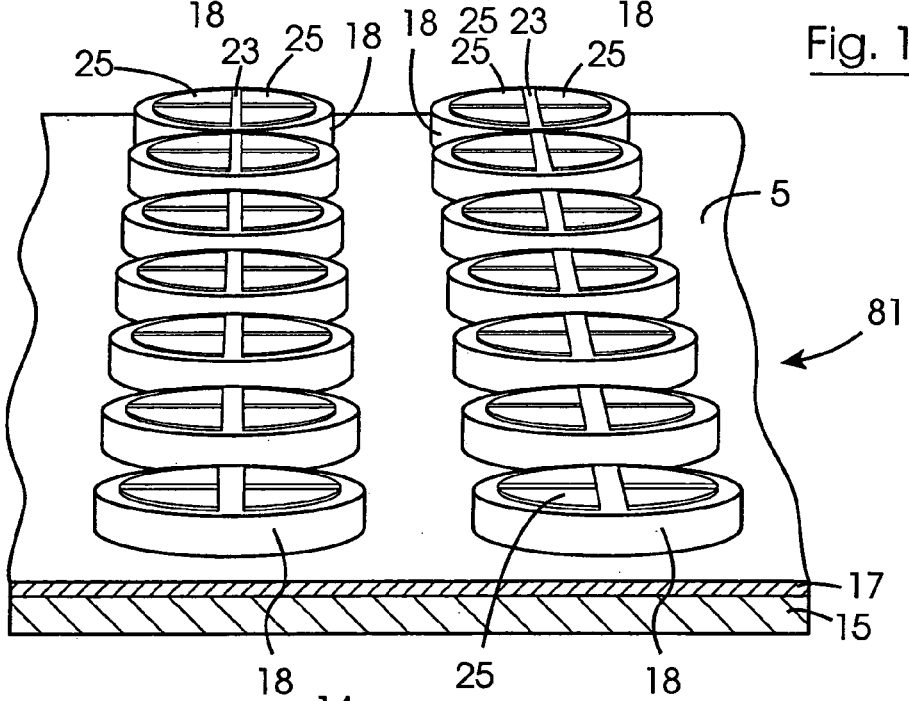
FIG. 20 is a top perspective view of a part similar to that of FIG. 18 of the semiconductor wafer of FIG. 19.
Figure 19:
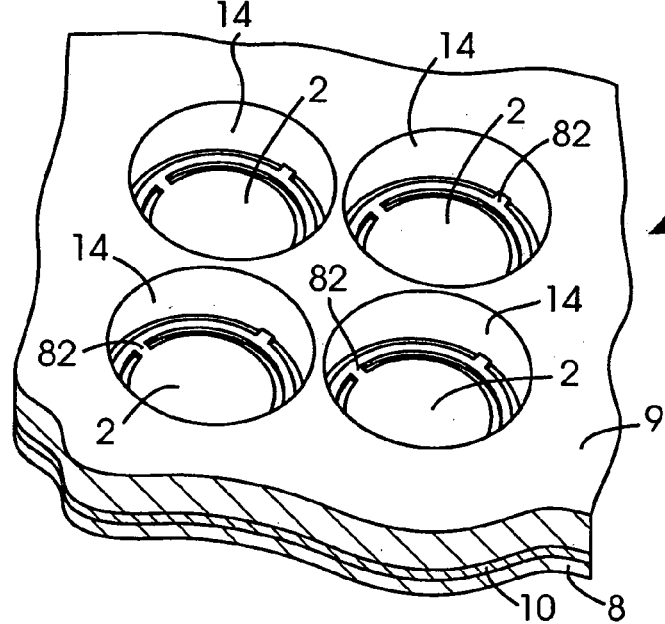
FIG. 19 is an underneath perspective view of a part similar to that of FIG. 8 of a semiconductor wafer according to another embodiment of the invention.

Referring now to FIGS. 19 and 20, there is illustrated a portion of a component substrate 80 and a portion of a base substrate 81 of a semiconductor wafer according to another embodiment of the invention. The semiconductor wafer according to this embodiment of the invention is not illustrated, however, the semiconductor wafer is substantially similar to that already described with reference to FIGS. 1 to 18, and similar components are identified by the same reference numerals. In this embodiment of the invention the semiconductor wafer comprises a large array of micro-mirrors 2. The main difference between the semiconductor wafer of this embodiment of the invention and the semiconductor wafer 1 is that the micro-mirrors 2 are gimbal mounted by respective gimbal mountings 82, in a manner described and illustrated in U.S. Pat. No. 6,201,631. The cavities 14 in the handle layer 9 are of diameter sufficient for facilitating tilting of both the micro-mirrors 2 and their corresponding gimbal mountings 82 into the cavities 14. Four electrodes 25 are provided on each pedestal 18 for controlling tilting of the mirrors 2 about their respective gimbal axes. Otherwise, the component substrate 80 is similar to the component substrate 4 of the semiconductor wafer 1 and the base substrate 81 is also similar to the base substrate 5 of the semiconductor wafer 1.

It is envisaged that although the addressing terminals 33 have been described as being formed on the top surface of the terminal carrier 30, in certain cases, it is envisaged that the addressing terminal 33 may be formed on the bottom surface of the base substrate 5. In which case, the need to provide the conductors 36 through the vias 35 would not arise.

Additionally, it is envisaged that in certain cases, the addressing tracks instead of being formed on the bottom surface of the base substrate may be formed on the intermediate surface defined by the buried oxide layer 17. In which case, fabrication of the base substrate would be appropriately altered for facilitating formation of the addressing tracks on the intermediate surface and for connecting the addressing tracks to the respective corresponding conductors 28 and 36. Indeed, it is envisaged that in certain cases some of the addressing tracks may be formed on the bottom surface of the base substrate, while others of the addressing tracks would be formed on the intermediate surface of the base substrate.

It is also envisaged that the bottom surface 16 of the base substrate may be fabricated with electronic components, such as, for example, CMOS devices or other such devices. Additionally, electronic components such as CMOS devices and other such components may be fabricated in the top surface 34 of the terminal carrier 30, and indeed, in certain cases may be fabricated in the top surfaces of the pedestals 18. Where it is desired to form components in the top surface of the terminal carrier 30, it is envisaged that the terminal carrier will be of a relatively large area, suitable for accommodating such components and devices. Further, it is envisaged that CMOS or other devices may be formed on the intermediate surface of the base substrate.

While the micro-machined components have been described as being micro-mirrors, the micro-machined components may be any other components besides micro-mirrors. It will also be appreciated that the micro-mirrors or other such micro-machined components in the component substrate may be arranged in any other arrangement besides a matrix array.

The invention claimed is:

1. A semiconductor wafer comprising a support substrate and a component substrate carried on the support substrate, the component substrate comprising:
   a membrane layer having a plurality of spaced apart micro-machined components formed therein, and
   a handle layer supporting the membrane layer and having a plurality of cavities corresponding to the micro-machined components extending through the handle layer to the respective corresponding micro-machined components,
   the support substrate having a first surface facing in a first direction and defining a second surface facing in a second direction away from and opposite to the first direction, the support substrate defining an intermediate surface at a level intermediate the first and second surfaces and facing in the second direction, the support substrate comprising:

a plurality of spaced apart pedestals extending in the second direction from the intermediate surface into respective corresponding ones of the cavities in the handle layer of the component substrate, each pedestal terminating in the second surface spaced apart from the corresponding micro-machined component for accommodating movement of the micro-machined component, at least one electrode carried on the second surface of each pedestal for co-operating with the corresponding micro-machined component, a plurality of electrically conductive addressing tracks on one of the first and the intermediate surfaces of the support substrate for carrying address signals to be conducted to the respective electrodes, and an electrical conductor corresponding to each electrode extending through a corresponding via through the corresponding pedestal from the electrode to a corresponding one of the addressing tracks on the support substrate for conducting the corresponding address signal to the corresponding electrode.

2. A semiconductor wafer as claimed in claim 1 in which a plurality of mutually insulated electrodes are carried on each pedestal, and each electrode is connected to the corresponding one of the addressing tracks on the support substrate by the corresponding one of the electrical conductors extending through the corresponding one of the vias.

3. A semiconductor wafer as claimed in claim 1 in which the addressing tracks on the support substrate communicate the corresponding electrodes on the pedestals with a plurality of corresponding mutually insulated addressing terminals for addressing the electrodes.

4. A semiconductor wafer as claimed in claim 3 in which the support substrate comprises a terminal carrier extending in the second direction from the intermediate surface for carrying the addressing terminals, and an electrical conductor corresponding to each addressing terminal extends from the corresponding addressing terminal through a corresponding via through the terminal carrier to the corresponding one of the addressing tracks on the support substrate for communicating the addressing terminal with the corresponding addressing track.

5. A semiconductor wafer as claimed in claim 4 in which the terminal carrier terminates in the second surface, and the addressing terminals are located on the second surface.

6. A semiconductor wafer as claimed in claim 5 in which the second surface defined by the terminal carrier defines a common plane with the second surfaces of the respective pedestals.

7. A semiconductor wafer as claimed in claim 1 in which the addressing tracks are located on the first surface of the support substrate.

8. A semiconductor wafer as claimed in claim 7 in which the vias through the respective pedestals extend to the first surface for accommodating the corresponding electrical conductors therethrough to the addressing tracks.

9. A semiconductor wafer as claimed in claim 1 in which the addressing tracks are located on the intermediate surface of the support substrate, and the vias through the respective pedestals extend to the intermediate surface for accommodating the corresponding electrical conductors to the addressing tracks.

10. A semiconductor wafer as claimed in claim 1 in which the handle layer defines a first surface of the component substrate, the first surface of the component substrate facing in the first direction, and the component substrate being carried on the support substrate with the first surface of the component substrate abutting the intermediate surface of the support substrate.

11. A semiconductor wafer as claimed in claim 1 in which the support substrate comprises a base layer defining the first and the intermediate surfaces, the pedestals extending in the second direction from the base layer.

12. A semiconductor wafer as claimed in claim 11 in which an insulating layer is located between the base layer and the respective pedestals of the support substrate.

13. A semiconductor wafer as claimed in claim 12 in which the insulating layer extends over the surface of the base layer of the support substrate and defines the intermediate surface.

14. A semiconductor wafer as claimed in claim 1 in which the transverse cross-sectional area of each pedestal is substantially similar to the area of the corresponding micro-machined component in plan view.

15. A semiconductor wafer as claimed in claim 1 in which the transverse cross-sectional area of each cavity in the handle layer of the component substrate substantially defines the transverse cross-sectional area of the corresponding pedestal.

16. A semiconductor wafer as claimed in claim 1 in which the respective pedestals are identical to each other.

17. A semiconductor wafer as claimed in claim 1 in which the second surfaces of the respective pedestals define a common plane.

18. A semiconductor wafer as claimed in claim 1 in which an insulating layer is located between the handle layer and the membrane layer of the component substrate.

19. A semiconductor wafer as claimed in claim 18 in which each cavity through the handle layer of the component substrate extends through the insulating layer between the handle layer and the membrane layer to the corresponding micro-machined component.

20. A semiconductor wafer as claimed in claim 1 in which the membrane layer and the handle layer of the component substrate are of semiconductor material.

21. A semiconductor wafer as claimed in claim 1 in which the support substrate is of semiconductor material.

22. A semiconductor wafer as claimed in claim 1 in which the micro-machined components are micro-mirrors.

23. A semiconductor wafer as claimed in claim 1 in which the respective micro-machined components are identical to each other.

24. A semiconductor wafer as claimed in claim 1 in which the micro-machined components are arranged in a matrix array defining a plurality of spaced apart columns and spaced apart rows of the micro-machined components.

* * * * *